(12) United States Patent
Nakase et al.

(10) Patent No.: US 6,538,308 B1
(45) Date of Patent: Mar. 25, 2003

(54) SEMICONDUCTOR APPARATUS WITH HEAT RADIATION STRUCTURE FOR REMOVING HEAT FROM SEMICONDUCTOR ELEMENT

(75) Inventors: Yoshimi Nakase, Anjo (JP); Takanori Teshima, Okazaki (JP); Yukinori Migitaka, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/351,458

(22) Filed: Jul. 12, 1999

(30) Foreign Application Priority Data

Jul. 14, 1998 (JP) .............................. 10-199073
May 14, 1999 (JP) .............................. 11-134809

(51) Int. Cl.[7] .......................................... H01L 23/495
(52) U.S. Cl. ...................... 257/675; 257/717; 257/718
(58) Field of Search ................. 257/718, 719, 257/722, 706, 720, 675, 712, 717, 694; 438/FOR 417; 29/25.01

(56) References Cited

U.S. PATENT DOCUMENTS

| 4,141,030 A | | 2/1979 | Eisele et al. |
| 4,538,170 A | | 8/1985 | Yerman |
| 4,646,129 A | | 2/1987 | Yerman et al. |
| 4,827,082 A | | 5/1989 | Horiuchi et al. |
| 5,345,107 A | * | 9/1994 | Daikoku et al. ............ 257/717 |
| 5,708,299 A | | 1/1998 | Teramae et al. |
| 6,038,156 A | * | 3/2000 | Inam et al. ................. 363/133 |

FOREIGN PATENT DOCUMENTS

| JP | 54-40569 | 3/1979 |
| JP | 54-95183 | 7/1979 |
| JP | 59-31042 | 2/1984 |
| JP | 59-38734 | 9/1984 |
| JP | 61-251043 | 11/1986 |
| JP | 61-265849 | 11/1986 |
| JP | 62-92349 | 4/1987 |
| JP | 62-141751 | 6/1987 |
| JP | 62-287649 | 12/1987 |
| JP | 63-96946 | 4/1988 |
| JP | 1-228138 | 9/1989 |
| JP | 3-20067 | 1/1991 |
| JP | 4-249353 | 9/1992 |
| JP | 6-291223 | 10/1994 |
| JP | 7-38013 | 2/1995 |
| JP | 7-273276 | 10/1996 |
| JP | 8-330338 | 12/1996 |
| JP | 10-56131 | 2/1998 |

OTHER PUBLICATIONS

Electronic Technology 1999–5, pp. 56–59.

* cited by examiner

Primary Examiner—Long Pham
Assistant Examiner—Ginette Peralta
(74) Attorney, Agent, or Firm—Harness, Dickey & Pierce, PLC

(57) ABSTRACT

A semiconductor element, and a pair of insulation substrates sandwiching the semiconductor element therebetween forms a substrate unit. The substrate unit is press-fitted in a recess provided between first radiation block and cooling block. The press-fitting of the substrate unit is performed by a second radiation block which is screwed to push the first radiation block toward the cooling block. A high thermal-conductive radiation material is disposed at the interfaces between each of the insulation substrates and each of the blocks to keep adhesiveness therebetween.

24 Claims, 11 Drawing Sheets

SEMICONDUCTOR APPARATUS WITH HEAT RADIATION STRUCTURE FOR REMOVING HEAT FROM SEMICONDUCTOR ELEMENT

CROSS REFERENCE TO RELATED APPLICATIONS

This application is based upon and claims the benefit of Japanese Patent Applications No. 10-199073, filed on Jul. 14, 1998, and No. 11-134809 filed on May 14, 1999, the contents of which are incorporated herein by reference.

BACKGROUND OF THE INVENTION

1. Field of the Invention

This invention relates to a semiconductor apparatus including a semiconductor element, and particular to a cooling structure for the semiconductor element such as a power MOSFET or an IGBT.

2. Description of the Related Art

A semiconductor element (semiconductor chip) such as power MOSFET or an IGBT controls large current, and accordingly produces a large amount of heat. Therefore, as a manner for cooling the semiconductor chip, various constitutions utilizing an air-cooling type radiation fin, a water-cooling type cooling block, and the like for removing heat from the semiconductor chip have been proposed by JP-A-62-92349, JP-A-63-96946, JP-A-62-141751, JP-A-61-265849, JP-A-3-20065, and the like.

However, the conventional constitutions have the following problems in a practical usage. For instance, a large size of the radiation fin is required to increase a radiation amount. When a water-cooling type cooling members is used to improve a radiation efficiency, water as refrigerant necessitates a passage thereof. The passage constitution is liable to be complicated to complicate the apparatus and to increase the size of the apparatus as a whole.

When a radiation member is attached to the semiconductor element, assembling time may be lengthened according to an arrangement of the two members. Further, because the radiation member assembled with the semiconductor element makes the semiconductor apparatus complicated and sized larger, the mountability of the semiconductor apparatus deteriorates especially when the semiconductor apparatus must be mounted in a limited space within an automotive engine room when it is used for an inverter of an electric vehicle.

When the semiconductor apparatus includes several semiconductor elements, there arise problems such that radiation members must be assembled with the respective semiconductor elements, the arrangement of the semiconductor elements may be limited according to the arrangement relationship with the radiation members, and the like. Each radiation member and each semiconductor element generally contact with each other through an insulation substrate for holding the semiconductor element, and a radiation passage for transmitting heat from the semiconductor element to the radiation member is provided to improved the radiation property. In this case, radiation grease is disposed between both members to fill gaps produced by surface irregularity and waviness to enhance adhesiveness therebetween. However, because the radiation grease includes oil as a main component, the viscosity of the grease is lowered by heat produced from the element (for instance, at 150° C. or more). The grease with the lowered viscosity is liable to flow out to deteriorate the adhesiveness described above, resulting in deterioration of the radiation property.

SUMMARY OF THE INVENTION

The present invention has been made in view of the above problems. A first object of the present invention is to provide a practical novel structure for radiating heat produced from a semiconductor element in a semiconductor apparatus. A second object of the present invention is to provide a semiconductor apparatus having a radiation structure that can be easily assembled. A third object is to simplify the radiation structure. Also, a fourth object is to improve mountability of the semiconductor apparatus, and a fifth object is to improve adhesiveness between an insulation substrate holding a semiconductor element and a radiation member.

Briefly, according to a first aspect of the present invention, a semiconductor apparatus has a substrate unit composed of a semiconductor element and a pair of insulation substrates holding the semiconductor element therebetween, and first and second radiation members for radiating heat produced from the substrate unit and defining a recess therebetween into which the substrate unit is inserted in an insertion direction. The semiconductor apparatus further has a fixing member for fixing the substrate unit within the recess by being inerted into one of the first and second radiation members in the insertion direction.

Thus, because the semiconductor unit and the fixing member can be inserted relative to the radiation members in the same direction, the assembling becomes easy. Because the substrate unit is sandwiched between the first and second radiation members, the heat produced from the substrate unit can be radiated from both side thereof, resulting in high radiation property.

According to a second aspect of the present invention, a semiconductor apparatus includes first and second substrate units, first and second pairs of radiation members defining first and second recesses therebetween which respectively hold the first and second substrate units therein, and a common pushing member disposed between the first and second pairs of radiation members for pushing the first and second pairs of radiation members to fix the first and second substrate units in the first and second recesses. This makes assembling easy as well.

According to a third aspect of the present invention, a semiconductor apparatus includes a plurality of substrate units, and a radiation member holding the plurality of substrate units for radiating heat from the substrate units and having a single refrigerant passage therein in which refrigerant flows for absorbing the heat. In this case, the single refrigerant passage does not require any connection members, resulting in simple structure of the water-cooling type semiconductor apparatus.

According to a fourth aspect of the present invention, a semiconductor apparatus includes a substrata unit, and a radiation member having a first wall on which the substrate unit is disposed and a second wall on an opposite side of the first wall. The second wall is flat. The flat second wall makes mountability of the semiconductor apparatus easy.

According to a fifth aspect of the present invention, a semiconductor apparatus includes a substrate unit, a radiation member disposed in contact with the substrate unit through a contact material for radiating heat produced from the substrate unit. The contact material is composed of a resin material having thermal resistance and flexibility and a thermal-conductive compounding material contained in the resin material. In this case, the contact material fills gaps produced in the interface between the substrate unit and the radiation member by surface irregularity and waviness of the substrate unit and the radiation member, realizing high adhesiveness at the interface. Further, even when the radiation member and the substrate unit are relatively displaced, the contact material can follow the displacement to keep the high adhesiveness. This results in improvement of the radiation property.

BRIEF DESCRIPTION OF THE DRAWINGS

Other objects and features of the present invention will become more readily apparent from a better understanding of the preferred embodiments described below with reference to the following drawings.

DETAILED DESCRIPTION OF THE PREFERRED EMBODIMENTS

First Embodiment

In a first preferred embodiment, a semiconductor apparatus according to the present invention is used as an IGBT module in which an IGBT (Insulated Gate Bi-polar Transistor) is cooled by a water-cooling type radiation part, and is applied to an inverter for performing an ac conversion between a battery and a motor of a hybrid powered vehicle and the like.

Figure 1:
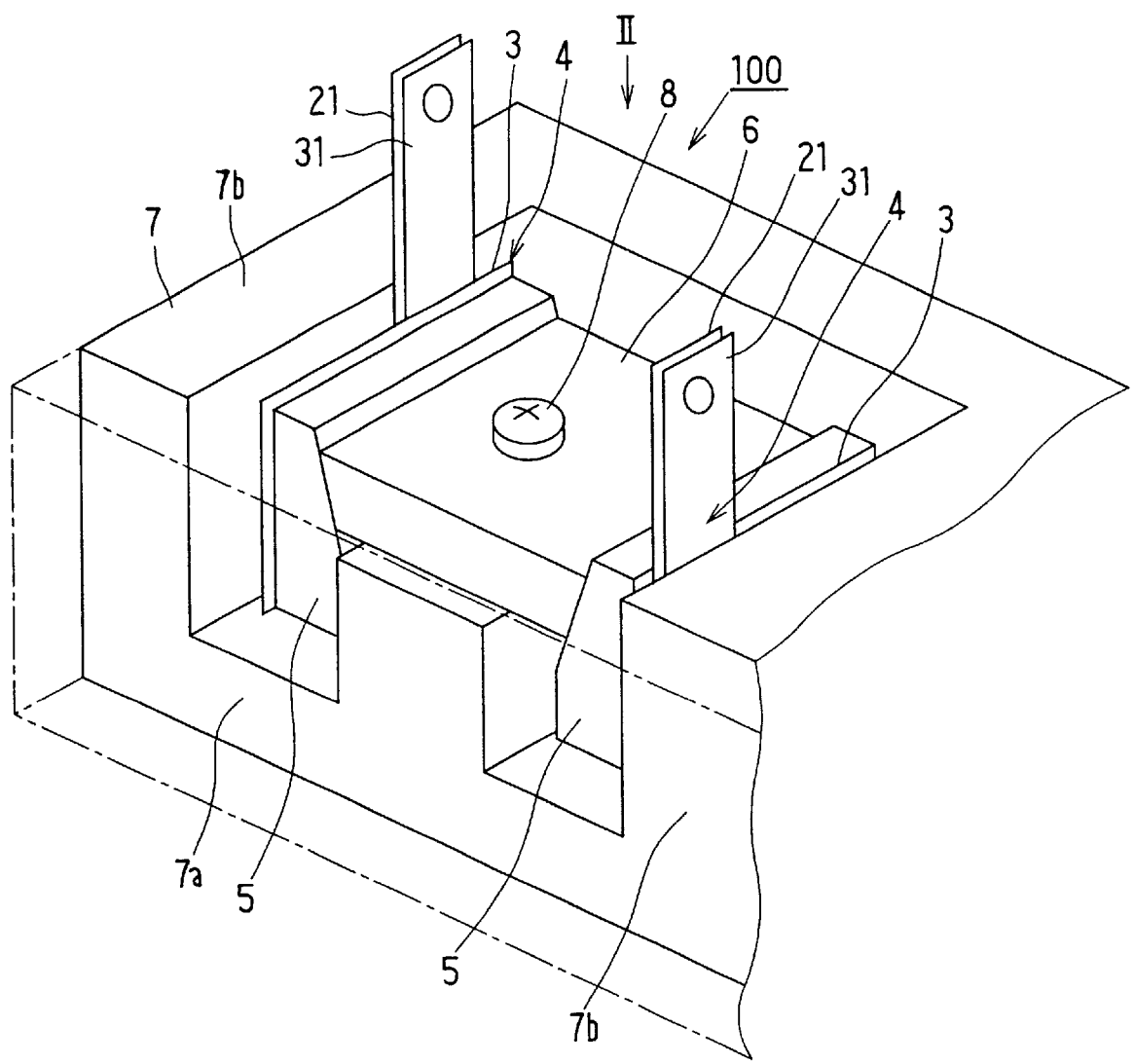
FIG. 1 is a perspective view showing a semiconductor apparatus in a first preferred embodiment.
Figure 2:
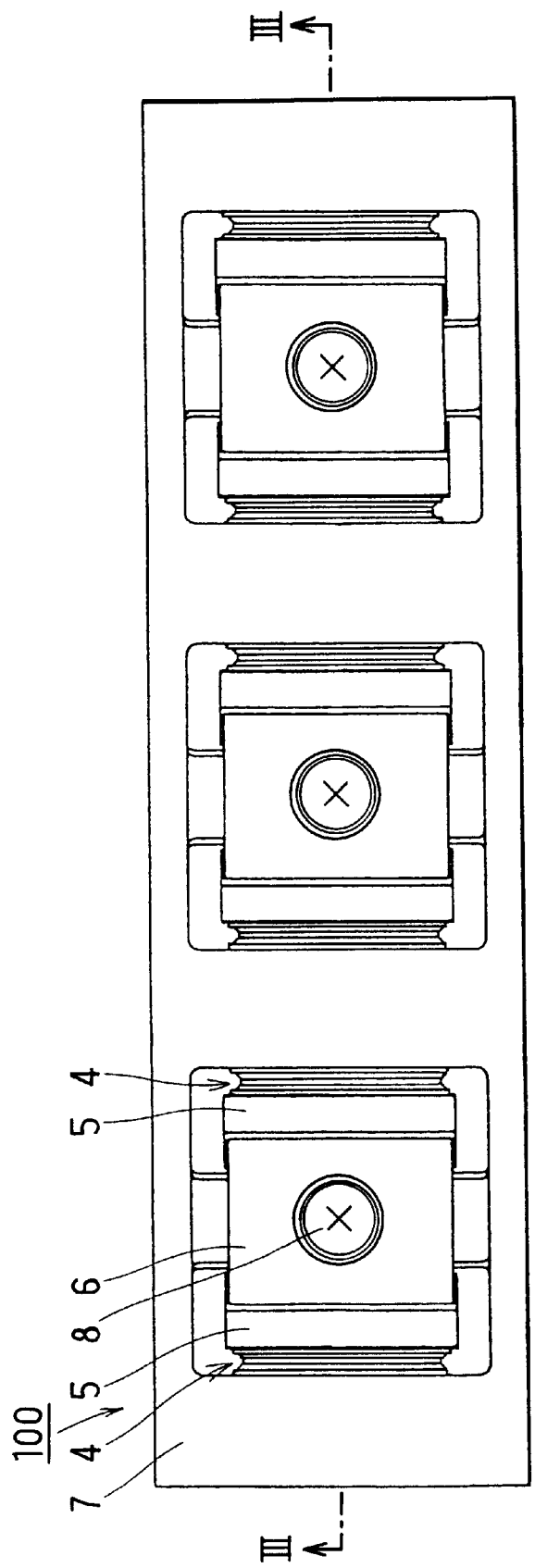
FIG. 2 is a view showing the semiconductor apparatus from a side indicated by an arrow II in FIG. 1.
Figure 3:
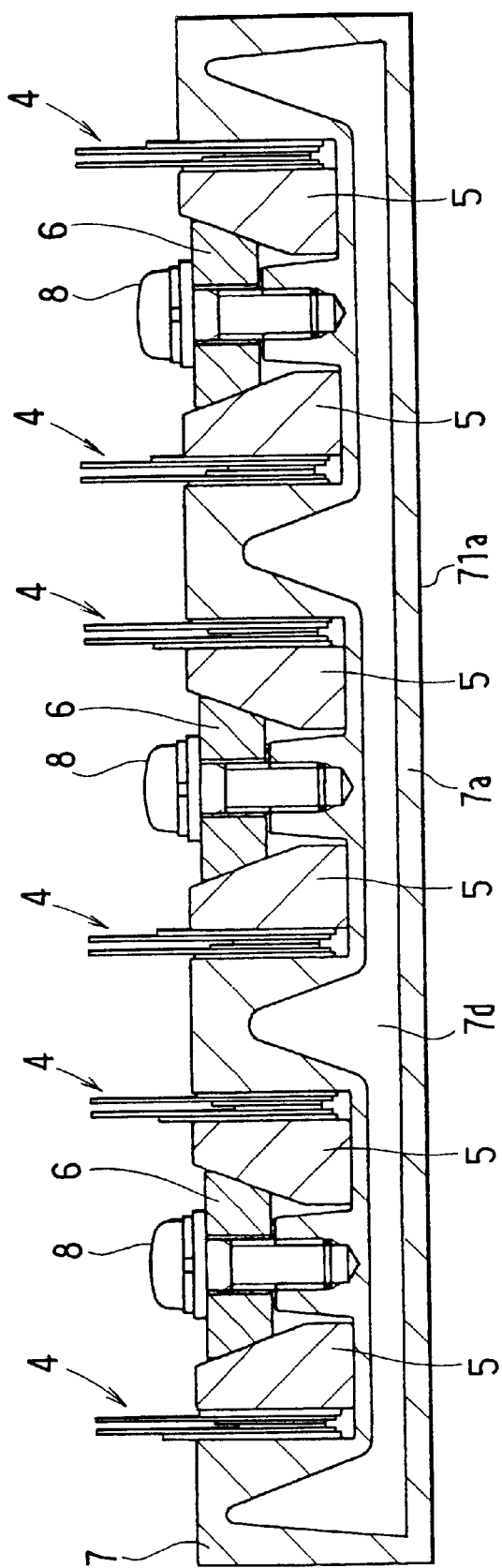
FIG. 3 is a cross-sectional view taken along a III—III line in FIG. 2.

Referring to FIGS. 1 to 4, in the semiconductor apparatus (IGBT module) 100 according to the first embodiment, one (or several) semiconductor element(s) 1 is disposed between a pair of high thermal conductivity insulation substrates 2, 3 to form a substrate unit 4. After that, the substrate unit 4 is pressed against a cooling block 7 by radiation blocks 5, 6 by fastening a screw 8. In this embodiment, as shown in FIG. 3, six substrate units 4 are arranged in series. Incidentally, in FIG. 1, a part of a contour is indicated by one-dot chain lines.

Figure 4:
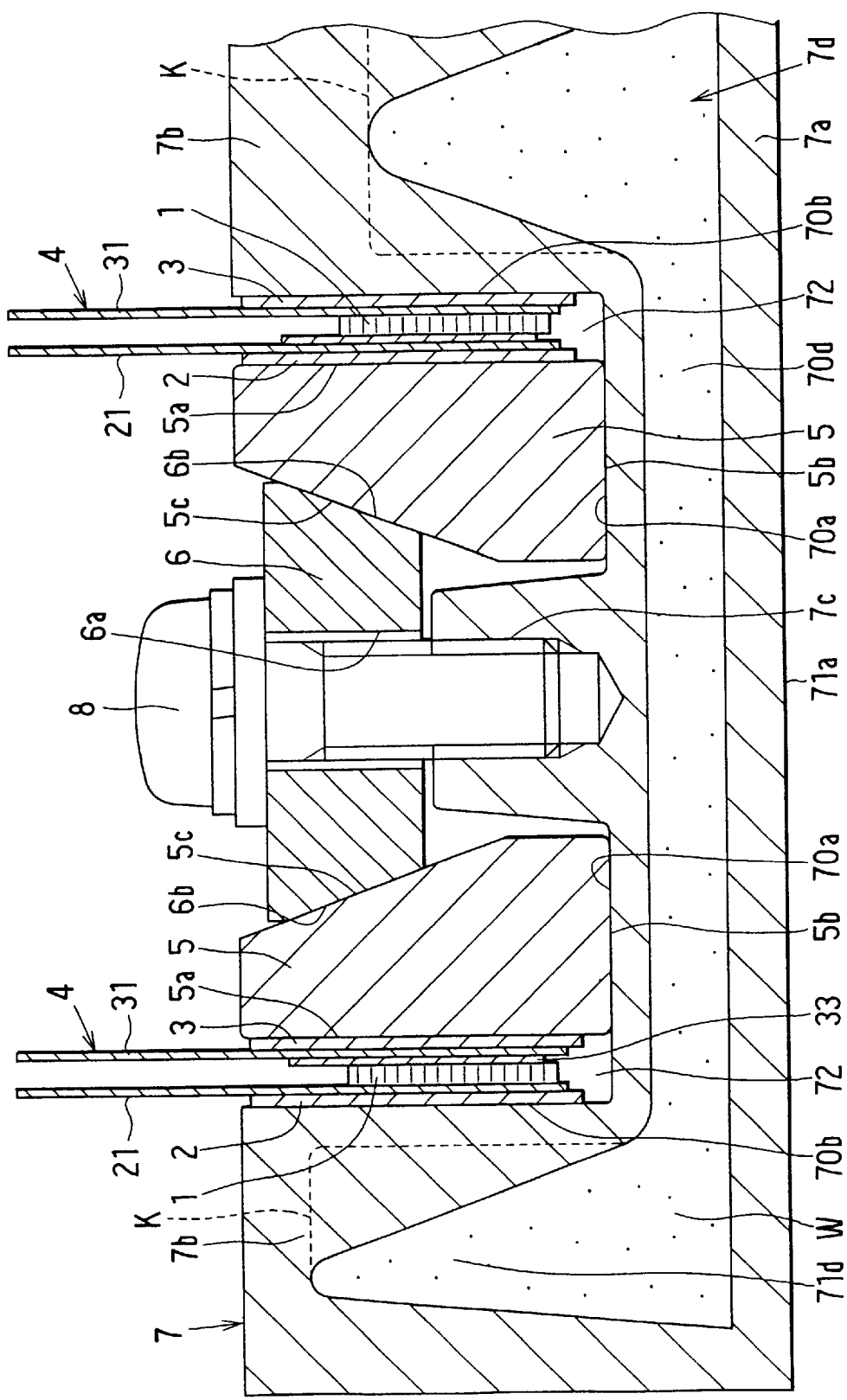
FIG. 4 is a partially enlarged view of FIG. 3.
Figure 5A:
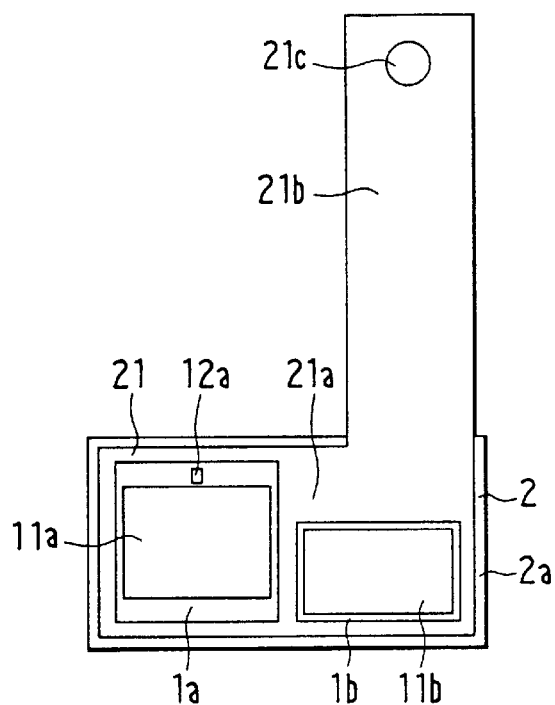
FIGS. 5A and 5B are views showing a detailed constitution of a substrate unit shown in FIG. 4.
Figure 5B:
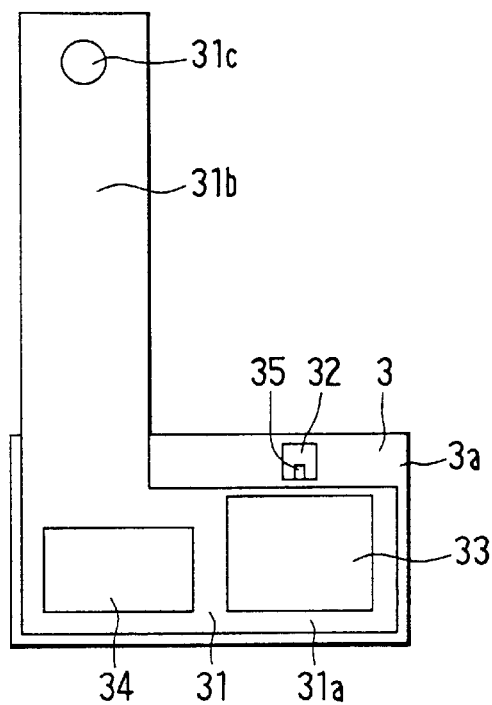

Next, detailed constitution of each part will be explained. First, the detailed constitution of the substrate unit 4 is shown in FIGS. 5A and 5B. FIG. 5A shows the semiconductor element 1 and the insulation substrate 2 (the left side in FIG. 4), and FIG. 5B shows the insulation substrate 3 (the left side in FIG. 4). The semiconductor element 1 is composed of a plate-like IGBT chip 1a and a fly-wheel diode (FWD) chip 1b. Both chips 1a, 1b form a main element in the inverter for performing the ac conversion. The insulation substrates 2, 3 are composed of high thermal-conductive substrates having a rectangular shape and, for instance, approximately 170 W/mK in thermal conductivity, and sandwich therebetween the chips 1a, 1b of the semiconductor element 1. The substrates 2, 3 are, for instance, made of aluminum nitride.

As shown in FIG. 5A, the insulation substrate 2 has an inner surface 2a for supporting the semiconductor element 1 thereon. An electrode pattern 21 is disposed on the inner surface 2a. The electrode pattern 21 is composed of a plate member having a thickness of approximately 0.5 mm and made of copper, aluminum, or the like, and is directly attached to the inner surface 2a by fusing, brazing, or the like.

The shape of the electrode pattern 2a will be explained in more detail. The electrode pattern 21 is composed of a rectangular base portion 21a and a terminal portion 21b for being connected to an external wire. The terminal portion 21b protrudes from the base portion 21a in an upper direction in FIG. 5A to project from the insulation substrate 2. The base portion 21a and the terminal portion 21b are integrated with each other. The IGBT chip 1a and the FWD chip 1b are brazed (for instance, soldered) to the base portion 2a. In this case, the IGBT chip 1a is joined to the base portion 21a through brazing metal (for instance, soft solder) at a collector electrode thereof not shown. Likewise, the FWD chip 1b is joined to the base portion 21a through brazing metal (for instance, soft solder) at a back side electrode thereof not shown.

As shown in FIG. 5B, the insulation substrate 3 has an inner surface 3a for supporting the semiconductor chip thereon, and electrode patterns 31, 32 are provided on the inner surface 31a. The electrode patterns 31, 32 are composed of plate members having, for instance, 0.5 mm in thickness and made of copper, aluminum, or the like, and are directly attached to the inner surface 3a by fusing, brazing, or the like.

First, the shape of the electrode pattern 31 will be specifically explained. The electrode pattern 31 is composed of a base portion 31a and a terminal portion 31b for being connected to an external wire. The terminal portion 31b protrudes from the base portion 31a in an upper direction in FIG. 5b to project from the insulation substrate 3. The base portion 31a and the terminal portion 31b are integrated with each other. The base portion 31a has rectangular joint portions 33, 34 which protrude outwardly (in a vertical direction relative to a paper space of FIG. 5B). The joint portion 33 has a size approximately equal to or slightly smaller than that of an emitter electrode 11a of the IGBT chip 1a, and has a projection height of approximately 0.5 mm. The joint portion 34 has a size approximately equal to or slightly smaller than that of a front side electrode 11b of the FWD chip 1b, and has a projection height of approximately 0.5 mm.

On the other hand, the electrode pattern 32 has a square joint portion 35 protruding outwardly (in the vertical direction relative to the paper space of FIG. 5B). The size of the joint portion 35 is approximately equal to or slightly smaller than that of a gate electrode 12 of the IGBT chip 1a, and the projection height of the joint portion 35 is approximately 0.5 mm. These joint portions 33, 34, 35 are made of molybdenum, tungsten, or the like, and are directly attached to the electrode patterns 31, 32, respectively, by brazing or the like.

Further, brazing metal (for instance, soft solder) is disposed on the joint portions 33, 34, 35 by printing or the like, and the insulation substrates 2, 3 are overlapped with each other so that the emitter electrode 11a and the gate electrode 12a of the IGBT chip 1a, and the surface side electrode 11b of the FWD chip 1b abut the joint portions 33, 34, 35 of the insulation substrate 3 through the brazing metal, respectively. Successively, the abutting portions are heated in a heating furnace or the like to undergo a reflow treatment. Accordingly, the abutting portions are brazed (soldered), thereby forming the substrate unit 4.

Incidentally, the electrode patterns 21, 31 has through holes 21c, 31c at end portions thereof. One of the patterns 21, 31 is connected to the battery and the other of the patterns 21, 31 is connected to the motor by inserting pole-like electrodes into the through holes 21c, 31c and fastening them with bolts or the like, respectively. The electrode pattern 32 is connected to an external control circuit by wire bonding or the like.

Next, the blocks 5, 6, 7 constituting the radiation structure of the semiconductor apparatus 100 will be explained. First, as shown in FIG. 4, the first radiation block 5 has a cross-sectional shape surrounded by flat surfaces 5a, 5b defining an approximately right-angle therebetween and an inclined flat surface 5c. That is, the first radiation block 5 has a generally rectangular shape, a part of which is cut. The second radiation block 6 has a trapezoid shape in cross-section, and has a hole 6a through which the screw 8 passes. The radiation blocks 5, 6 are made of material such as aluminum, with high thermal conductivity, and is formed by cutting work, die-cast processing, or the like.

The cooling block 7 is composed of a base portion 7a and protruding portions 7b protruding from a flat surface 70a of the base portion 7a to have flat surfaces 70b defining an approximately right-angle with the flat surface 70a. The base portion 7a extends in an arrangement direction of the several base members 4, i.e., of the semiconductor elements 1. Further, a refrigerant passage 7d for refrigerant W (for instance, water) is provided inside the cooling block 7 to extend in the arrangement direction of the semiconductor elements 1. The refrigerant passage 7d is a single passage composed of a main passage 70d extending in the arrangement direction of the semiconductor elements 1 and sub-passages 71d extending within the protruding portions 7b. The refrigerant passage 7d further has inlet and outlet not shown for the refrigerant W, and is connected to a cooling tank or the like of the vehicle. Accordingly, for instance, water flows in the arrangement direction of the semiconductor elements 1.

The base portion 7a has a threaded hole 7c for engaging with the screw 8. Further, a flat surface 71a opposed to the flat surface 70a of the base portion 7a is provided as an installation surface. The semiconductor apparatus 100 is installed in a desired position within an automotive engine room (for instance, on the motor) through the installation surface thereof. The base portion 7a can additionally have installation holes into which screws are to be inserted for attaching the apparatus to a desired position of the vehicle by thread fastening. The cooling block 7 is also made of material such as aluminum having high thermal conductivity and is formed by cutting work, die-cast processing, or the like. Each sub-passage 71d may be shaped as shown by broken lines K in FIG. 4 to have a thickness on a side of the substrate unit 4 approximately equal to that of the main passage 70d. Accordingly, the cooling efficiency is improved.

The flat surface (protruding portion facing surface) 5a of the first radiation block 5 and the flat surface 70b of the protruding portion 7b define a specific gap therebetween to make a recess (insertion portion) 72 for receiving each substrate unit 4. Further, as shown in FIG. 4, the first radiation block 5 and the protruding portion 7b of the cooling block 7 are disposed symmetrically on both right and left sides of the screw as a center. In the present embodiment, the substrate units 4 disposed on the both right and left sides has an identical arrangement with each other; however, for instance, the substrate unit 4 on the right side may have an arrangement of the insulation substrates 2, 3 opposite to that of the substrate unit 4 on the left side.

On the left side of the screw 8 in FIG. 4, the first radiation block 5 contacts the outer surface of the insulation substrate 3 at the flat surface 5a thereof, contacts the flat surface 70a of the base portion 7a of the cooling block 7 at the flat surface (base portion contacting surface) 5b thereof, and contacts the trapezoid inclined surface 6b of the second radiation block 6 at the inclined surface 5c thereof. The cooling block 7 contacts the outer surface of the insulation substrate 2 at the flat surface 70b of the protruding portion 7b thereof.

On the right side of the screw 8 in FIG. 4, because the substrate unit 4 has the identical arrangement of that on the left side, the first radiation block 5 contacts the outer surface of the insulation substrate 2 at the flat surface 5a thereof, contacts the flat surface 70a of the base portion 7a at the flat surface 5b thereof, and contacts the trapezoid inclined surface 6b of the second radiation block 6 at the inclined surface 5c thereof. The cooling block 7 contacts the outer surface of the insulation substrate 3 at the flat surface 70b of the protruding portion 7b thereof.

Here, it should be noted that a high thermal-conductive radiation material 9 not shown in FIGS. 1 to 4 is disposed in the contact interfaces between the first radiation blocks 5 and the insulation substrates 2, 3, between the cooling block 7 and the insulation substrates 2, 3, and between the first radiation blocks 5 and the cooling block 7 so that these members contact therethrough. The high thermal-conductive radiation material 9 is a contact material including resin material 9a with heat resistance and flexibility, and a thermal-conductive compounding member 9b contained in the resin material 9a. The high thermal conductivity radiation material 9 enhances the radiation-property at the contact interfaces by securing the adhesiveness and the thermal conductivity.

Figure 6:
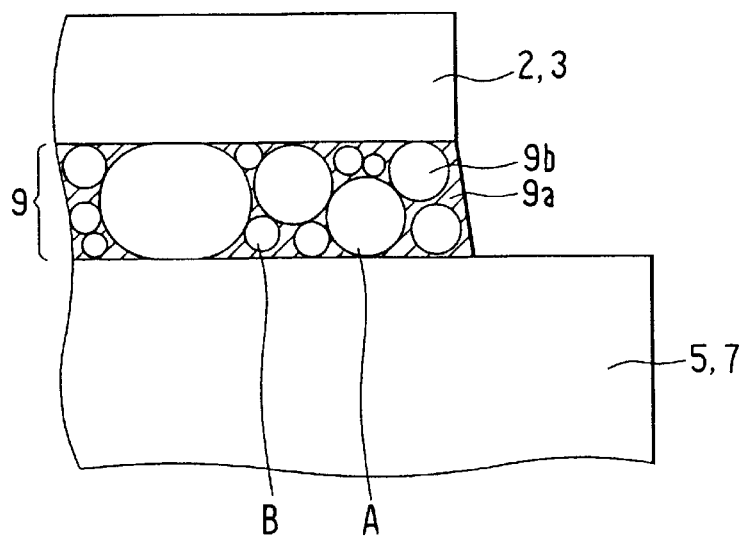
FIG. 6 is a schematic view showing a contact material.

Specifically, as shown in FIG. 6, the high conductive radiation material 9 is made of the resin material 9a including the compounding member (fillers) 9b having high conductivity at a high concentration (more than 50 vol %) to have a large thermal conductivity. The resin material 9a is thermosetting type extremely low elastic modulus material having low viscosity sufficient for filling gaps between respective two of the insulation substrates 2, 3, and the radiation block 5, and the cooling block 7 without forming any vacancies. The resin material 9a has no possibility of flowing and separating by heat.

The thermosetting type extremely low elastic modulus material utilized in the present embodiment is thermosetting resin having, after heat curing, low viscosity (for instance, 2.5P to 5P) and elastic modulus of equal to or less than 10 MPa, more preferably, equal to or less than 0.1 MPa. For instance, silicone gel (80 Pa to 160 Pa) can be used as such resin. On the other hand, the compounding member 9b is made of metal (for instance, silver or copper) including large diameter particles (large diameter fillers) A with an average particle diameter in a range of 5 μm to 50 μm, more preferably, in a range of 20 μm to 50 μm, and small diameter particles (small diameter fillers) B. A ratio of the small diameter fillers B relative to the large diameter fillers A in the particle diameter is in a range of 0.2 to 0.4, and a mixing ratio thereof is in a range of 1:1 to 1:13.

The high thermal-conductive radiation material 9, in which the compounding member 9b is mixed with silicone gel serving as the resin material 9a, is in a liquid state before heat curing. Therefore, after the liquid state radiation material 9 is coated on at least one of the surfaces of the contact interfaces, it is hardened by the heat curing in the state where the surfaces contact with each other (i.e., in the assembled state), whereby the surfaces adhere to each other at the contact interfaces. Thus, the contact interfaces can be filled with the resin material 9a without forming any vacancies, and at the same time, thermal conductivity can be secured by the compounding member 9b. Consequently, the radiation property at the contact interfaces is improved.

Further, the inclined surface 5c of the first radiation block 5 is pushed by the screw 8 fastened to the cooling block 7, through the second radiation block 6. Accordingly, the flat surface 5a of the first radiation block 5 pushes the outer surface of the insulation substrate 3 toward the flat surface 70b of the protruding portion 7b. The flat surface 5b generally perpendicular to the flat surface 5a is pushed against the flat surface 70a of the base portion 7a of the cooling block 7. Accordingly, the substrate unit 4 is press-fitted by the blocks 5, 7, thereby being fixed within the recess 72.

As described above, two sets of the substrate units 4, the first radiation blocks 5, and the protruding portions 7b of the cooling block 7 are disposed symmetrically on the right and left sides of the screw 8 and the second radiation block 6. That is, the second radiation block 6 pushes the pair of the substrate units 4 with force through the pair of the first radiation blocks 5 on the right and left sides, as a pushing member.

The semiconductor apparatus 100 having the constitution described above is assembled as follows. First, the liquid state high thermal-conductive radiation material 9 is applied to at least one of the flat surfaces 5b of the radiation blocks 5 and the flat surface 7a of the base portion 7a of the cooling clock 7, and to at least one of the outer surfaces of the insulation substrates 2, 3 of the assembled substrate units 4, and the flat surfaces 5a, 70b defining the recesses 72.

Then, each of the radiation blocks 5 is placed on the flat surface 70a of the base portion 7a of the cooling block 7 to define the gap between the flat surfaces 5a and 70b larger than the thickness of the substrate unit 4. Then, each of the substrate units 4 is inserted into the corresponding recess 72 from the upper side in FIG. 4 to be temporarily fixed between the blocks 5, 7. Successively, the second radiation block 6 is disposed on the cooling block 7.

Next, the screw 8 is inserted into the holes 6a, 7c from the upper side of the second radiation block 6 in FIG. 4, and is fastened therein. At that time, the second radiation block 6 moves along the inclined surfaces 5c of the first radiation blocks 5 in an insertion direction as the screw 8 is inserted, due to a shape effect of the inclined surfaces 5c, 6b of the radiation blocks 5, 6. Accordingly, the pair of the first radiation blocks 5 on the right and left sides is pushed outwardly to push the substrate units 4, respectively, so that each substrate unit 4 is fixed within the recess 72 while being pushed by the blocks 5, 7. As a result, the semiconductor apparatus 100 is completed.

In FIGS. 3 and 4, the end portions of the electrode patterns 21, 31 on the side of the through holes 21c, 31c protrude in the same direction (upper direction in the figure); however, the protruding direction is not limited to that. For instance, all the end portions may be protrude in a direction perpendicular to the paper spaces of FIGS. 3 and 4. The substrate units 4 may have the respective end portions protruding in different directions from one another.

Next, radiation effect in the present embodiment will be explained focusing on the left part relative to the screw 8 in FIG. 4.

The heat produced from the IGBT chip 1a and the FWD chip 1b is smoothly transmitted to refrigerant W through the back surfaces (on the side of the insulation substrate 2) of the IGBT chip 1a and the FWD chip 1b, the insulation substrate 2, the high thermal-conductive radiation material 9, and the protruding portion 7b of the cooling block 7, and is rapidly radiated therein. Simultaneously, the heat is smoothly transmitted to refrigerant W through the surfaces (on the side of the insulation substrate 3) of the IGBT chip 1a and the FWD chip 1b, the insulation substrate 3, the high thermal-conductive radiation material 9 from the outer surface of the insulation substrate 3, the first radiation block 5, and the base portion 7a of the cooling block 7 through the high thermal-conductive radiation material 9 from the flat surface 5b of the first radiation block 5, and is rapidly radiated. Accordingly, the heat is radiated from the both sides of the semiconductor element 1.

According to the present embodiment, when the first radiation block 5 and the cooling block 7 directly contacting the substrate unit 4 for removing the heat therefrom are cooperatively considered as a radiation unit, the second radiation block 6 and the screw 8 for fixing the substrate unit 4 can be considered as fixing members. In this embodiment, the substrate unit 4 and the screw 8 as the fixing member are assembled to the radiation unit 5, 7 in the identical direction. This makes the assembling step easy.

The screw 8 also functions as a support member for supporting the first radiation block 5 relative to the cooling block 7 by pushing the first radiation block 5 against the cooling block 7 in the insertion direction thereof when it is inserted into the cooling block 7. The second radiation block 6 further functions as a pushing member for pushing the protruding portion contacting surface 5a toward the protruding portion 7b by the insertion of the screw 8, so that the substrate unit 4 is press-fitted in the recess 72. The support member is not limited to the screw 8 as the fastening member. The second radiation block 6 functioning as the pushing member is made of a material having thermal conductivity to improve the radiation property; however, the second radiation block 6 needs not always be made of a material having thermal conductivity.

Further, in the present embodiment, the parts can be inserted into the radiation unit 5, 7 in the same direction. Therefore, the radiation unit 5, 7 can provide several recesses 72 on the element arrangement face 70a with two-dimensional flexibility even when it must hold several substrate units 4, i.e., several semiconductor elements 1. This makes possible to arrange the semiconductor elements 1 with high flexibility. For instance, the blocks 5, 6 may be extended in the direction perpendicular to the paper space of FIG. 4 so that several substrate units 4 can be arranged in the direction perpendicular to the paper space. Each of the substrate units 4 can be temporality fixed between the two blocks 5, 7 only by the insertion thereof into the recess 72 before being pushed by the fixing members 6, 8. It is not necessary to use an extra jig, resulting in easy assembling.

Also, according to the, present embodiment, the pair of the substrate units 4 can be fixed by the common pushing member, i.e., by the second radiation block 6. Therefore, six substrate units 4 can be fixed by three second radiation blocks 6 and three screws 8, resulting in decrease in assembling manhour and easy assembling.

Also, according to the present embodiment, the single refrigerant passage 7d is provided inside the cooling block 7 for cooling the several substrate units 4. It is not necessary to form separate refrigerant passages for the respective substrate units 4, and to employ separate connection members (such as pipes) and the like for connecting refrigerant passages. Therefore, the water-cooling type semiconductor apparatus can be provided with a simple structure and a reduced size.

Also, according to the present embodiment, the refrigerant passage 7d is composed of the main passage 70d extending to face all the substrate units 4 and the sub-passages 71d each extending in proximity to the surface of each. substrate unit 4. In the semiconductor element 1 of the present embodiment, the calorific value produced on the surface thereof is not largely different from that produced on the other surface thereof. However, in a case where the calorific value produced on the surface is much larger than that on the other surface in the semiconductor element, each of the sub-passages 71d can be provided in closely proximity to the specific surface. This makes effective radiation possible.

Also, according to the present embodiment, the surface of the substrate unit 4 is effectively cooled by refrigerant W flowing in the sub-passage 71d, while the other surface of the substrate unit 4 is cooled by the cooling block 7 through the radiation block 5. Thus, the water-cooling type semiconductor apparatus in the present embodiment has a simple passage constitution as compared to a case where the refrigerant passage is arranged in proximity to the both surfaces of each semiconductor element 1.

Also, each substrate unit 4 is constructed by sandwiching the semiconductor element 1 by the pair of insulation substrates 2, 3 having thermal conductivity, and the pair of insulation substrates 2, 3 is brought to be in contact with the respective blocks 5, 7. As a result, the insulating property of the semiconductor element 1 is secured. Because the surface 70a of the cooling block 7 for holding the semiconductor element 1 thereon and the opposing surface 71a thereof serving as the installation surface of the apparatus are made flat. This makes installation easy. Further, because the electrodes of the IGBT chip 1a and the FWD chip 1b are brazed to the electrode patterns 21, 31 of the insulation substrates 2, 3, the area of the joint portion is large. Accordingly, electrical resistance and thermal resistance become small, allowing large current to flow.

In the embodiment described above, the high thermal-conductive radiation material 9 is used as the contact material. Herebelow, the effects of the high thermal-conductive radiation material 9 will be explained in more detail.

In a conventionally semiconductor device having a heat radiation structure in which two members of a radiation unit and an insulation substrate holding a semiconductor element thereon are bonded to each other, radiation grease has been utilized. The grease is made of silicone oil mixed with fillers made of alumina, boron nitride, or the like having insulating property and high thermal conductivity. For instance, the thermal conductivity of alumina is approximately 20 W/mK to 30 W/mK, and the thermal conductivity of boron nitride (hexagonal) is approximately 40 W/mK. Further, the grease including these materials has approximately 0.8 W/mK in thermal conductivity.

To maintain the radiation property between the two members described above, the gap between the two members should be deceased as thin as possible without forming any vacancies including air or the like. This is because air has low thermal conductivity of approximately 0.03 W/mK. The thermal resistance (difficulty in transmitting heat) between the two members changes in inverse proportion to the thermal conductivity of material intervening between the two members, and in proportion to the thickness of the material.

Generally, the surface of the member has irregularity and waviness of several $\mu$m to several tens $\mu$m. Therefore, several tens $\mu$m gaps are inevitably produced due to the irregularity and the waviness when the two members are just attached to each other. The conventional radiation grease is applied to fill the gaps produced by the irregularity and the waviness between the two members. In this case, it is important not to increase the thickness of the gap between the two members by the grease.

Form this point of view, the conventional grease is required to have low viscosity sufficient for filling the surface irregularity and the waviness. The increase in the mixing ratio of the fillers having high thermal conductivity generally enhances the radiation property; however it simultaneously increases the viscosity. The increased viscosity makes it difficult to fill the irregularity with the grease and increases the thickness of the grease. To solve this problem, it is conceivable to decrease the viscosity of the oil contained in the grease as base material. However, the viscosity of the oil is further lowered at a high temperature to cause a problem such that the oil component flows out when the product is exposed to the high temperature. Especially, in a high exothermic power device that works at a high operational temperature, the radiation cannot be sufficiently performed due to the lowered viscosity of the base oil.

Incidentally, the radiation grease containing the oil as the base material does not have adhesiveness. Therefore, the two members must be mechanically fixed to each other by screw fastening and interposing between two block members for fixing as in the present embodiment, or the like.

On the other hand, conductive paste or conductive adhesive is known as a joining material having high thermal conductivity. These materials are primarily used for securing electrical conductivity. In general, Ag fillers are mixed with thermosetting epoxy resin to provide the conductive paste. Ag has not only high electrical conductivity but also high thermal conductivity of approximately 400 W/mK. Therefore, the conductive paste including the Ag fillers has thermal conductivity of approximately 2 W/mK to 3 W/mK, which is higher than that of the radiation grease.

The increase in content of the Ag fillers increases the thermal conductivity, however, simultaneously increase the viscosity similarly to the case of the radiation grease. Further, generally, the Ag fillers must contact with one another to secure the conductivity. To comply with this necessity, the Ag fillers are connected to one another to provide contact strength by epoxy resin (several GPa in elastic modulus) that is made relatively hard by heat curing.

The ratio of the epoxy resin is decreased as the content of the Ag fillers is relatively increased, so that the contact strength is reduced to reduce the conductivity. The adhesive strength is simultaneously decreased. Therefore, the content of Ag is approximately 90 wt % at most in the conventional conductive paste. In addition, because the radiation grease includes the oil as a base, it can flexibly follow respective displacement between the two members caused by thermal stress. As opposed to this, the conductive paste that is hardened by heat curing produces cracks by the displacement, and the cracks produce gaps capable of deteriorating the radiation property.

Based on the above-described studies concerning the contact materials for bonding the two members of the high exothermic device, it is considered that the contact material is required to have both high radiation property and flexibility, and further to have heat resistance. The conventional radiation grease and conductive paste are not sufficient to comply with these requirements.

To comply with these requirements, the high thermal-thermal conductive radiation material 9 composed of the resin material 9a with heat resistance and flexibility, and the thermal-conductive compounding member 9b contained in the resin material 9a is adopted as the contact material in the present embodiment. As a result, the adhesiveness and thermal conductivity between two members bonded through the contact material are secured to enhance the radiation property. The resin material 9a having both the heat resistance and flexibility is preferably thermosetting resin having elastic modulus of 0.1 MPa at most, such as silicone gel described above, silicone system resin, polyester system resin, or heat resistant rubber.

Next, various types of radiation materials 9 respectively composed of combinations of various resin materials 9a and compounding members 9b will be explained referring to FIGS. 7 to 9. In the FIGS. a1 and a2 represents two members which are to be bonded to each other, and correspond to two of the insulation substrates 2, 3, and the blocks 5, 6, 7.

Figure 7A:
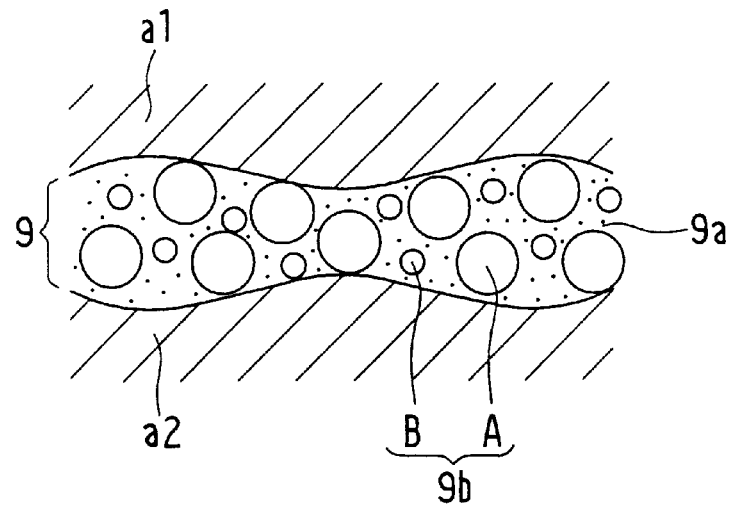
FIG. 7A is a schematic view showing a first example of the contact material.

A first type is substantially the same as that of the high thermal-conductive radiation material 9 shown in FIG. 6, and is composed of the resin material 9a such as silicone gel capable of providing low elastic modulus of 0.1 MPa at most even after heat curing, and high radiation fillers mixed therewith as the compounding member 9b (see FIG. 7A). The resin material 9a is entirely and three-dimensionally bridged by the heat curing. Therefore, the radiation material 9 does not flow out as the conventional radiation grease described above even when the product is exposed to a high temperature (for instance, more than 150° C.). Further, because the elastic modulus is low, the radiation material 9 can follow relative displacement between the two members a1 and a2 not to produced cracks therein.

Especially, in the present embodiment, because the insulation property of the device is secured by the insulation substrates 2, 3, the device can dispense with insulation fillers such as the conventional radiation grease, and can use metallic fillers (Ag, Cu, or the like) having higher thermal conductivity. The thermal conductivity reaches 1.3 W/mK when the spherical Cu fillers having approximately 6 μm in average particle diameter used as the compounding member 9b are mixed with silicone resin having approximately 0.3 Pa in viscosity before heat curing used as the resin material 9a, at a content of 93 wt %.

Further, in the first combination, as shown in FIG. 7A, it is found that a filling factor is increased by pushing the small diameter fillers B into gaps provided among the large diameter fillers A, while suppressing the increase in viscosity. For instance, as described above, the large diameter spherical particles (large diameter fillers) A are preferably in a range of 5 μm to 50 μm in average particle diameter, and more preferably in a range of 20 μm to 50 μm. The small spherical particles (small diameter fillers) B are 0.2 μm to 0.4 μm in average particle diameter and are mixed with the particles A at a mixing ratio of 1:1 to 1:13 relative to the particles A.

The filling factor of the fillers A, B is estimated in the following manner. That is, the weight of the fillers A, B is measured using a capacitance vessel, and the measured weight is converted into a filler volume using a true specific gravity of filler material. Then, a rate in volume of the fillers relative to the entire capacitance vessel is calculated. The rate in volume is preferably equal to or more than 0.2 by the measurement described above.

The metal as the compounding member may be one or a combination of more than two kinds of metallic materials such as Ag, Cu, Ni, Al, and Sn. In addition to the metallic materials, usable materials as the compounding member are high thermal conductive fillers such as ceramic system fillers made of aluminum nitride, silicon carbide, silicon nitride, boron nitride, or the like, single-crystal fillers made of silicon diamond, or the like, or graphite system fillers such as carbon fiber or carbon black. The shape of each particle of the compounding member is not limited to a sphere, and may be a flat shape. When the fillers are flat, it is oriented between the two members to further enhance the radiation property.

When the filling factor of the fillers is further increased, the fillers contact with one another. This contact produces friction, which appears as an increase in viscosity of the high thermal-conductive radiation material 9. Therefore, the mixing amount of the fillers, i.e., the mixing amount of the compounding member should not be increased more than a specific amount.

Next, a second type will be explained. In the second type, solvent for suppressing the increase in viscosity is mixed with the resin material at the step of coating, and after coating to one of the two members, the solvent is volatilized and the resin is hardened. After that, the other of the members is press-fitted to the one of the members. The solvent is requited not to easily volatilize during the coating work, but to easily volatilize by raising temperature. Especially, solvent having a boiling point equal to or higher than 125° C. such as buthyl-carbitol or naphtha is suitable for the solvent described above. The content of the Ag fillers can be increased up to 99 wt % by adding the solvent.

Figure 7B:
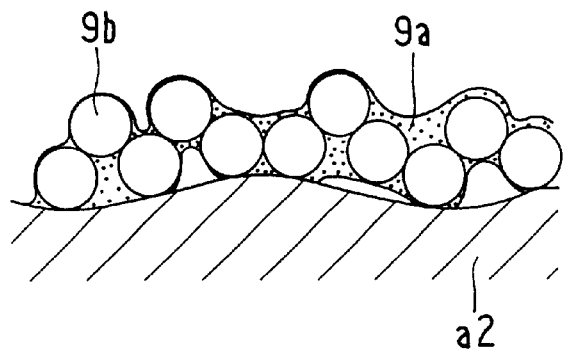
FIGS. 7B and 7C are schematic views showing a second example of the contact material.
Figure 7C:
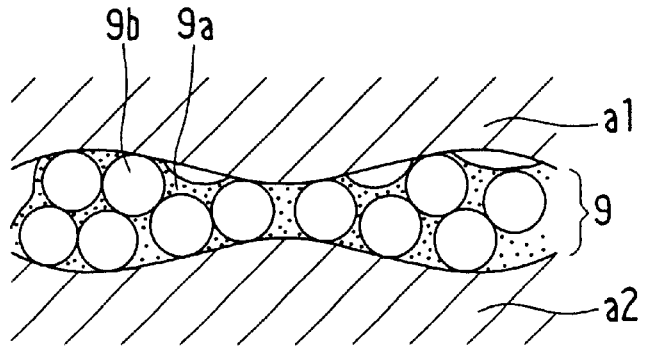

As shown FIG. 7B, in the second type after coating and volatilizing the solvent, and hardening the resin, the compounding member (fillers) 9b is not completely covered with resin, and gaps are produced among the compounding member 9b. This is different from the first type. However, because these gaps are filled with the resin deformed by pushing the two members so that the compounding member 9b contact with one another, high radiation property can be provided in the second type as well as the first type. To obtain this effect, the resin constituting the resin material 9a must be soft sufficient for deforming to fill the gaps by the pushing force as indicated in the first type. In the second type, because the resin material 9a is thermally hardened, the compounding member 9b and the resin material 9a do not flow out even at a high temperature.

Next, a third type will be explained. In the first and second types, the compounding member (fillers) 9a is particle, and the compounding fillers Are mixed with the resin material at a relatively large content to make contact with one another. As opposed to this, in the third type, the compounding fillers are brought to be contact with one another before being mixed with the resin material. These connecting fillers will be explained using Ag fillers as an example.

Figure 8A:
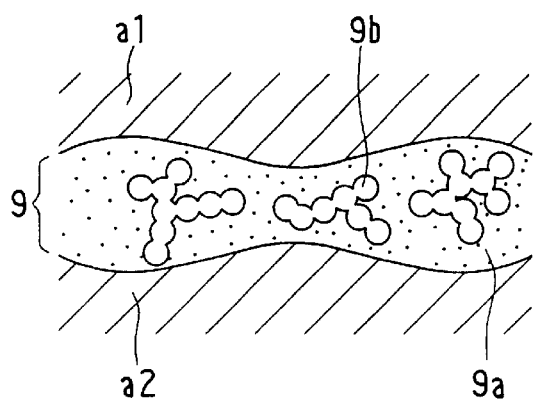
FIGS. 8A and 8B are schematic views showing a third example of the contact material.

Spherical Ag fillers (particles) are formed by crystal growth in a solution. The Ag fillers grown to a some extent flocculate with one another during the growth and are further grown by adjusting the solution so that cohesion acts among the Ag fillers. As a result, as shown in FIG. 8A, the several spherical Ag fillers connected to one another are formed. This kind of Ag fillers is commercialized as, for instance, a trade name E-20 which is produced by Tokuriki Chemical Institution. When, the connecting Ag fillers are used, the thermal conductivity is increased up to approximately 2.0 W/mK at a relatively low filler content of 79 wt %.

Figure 8B:
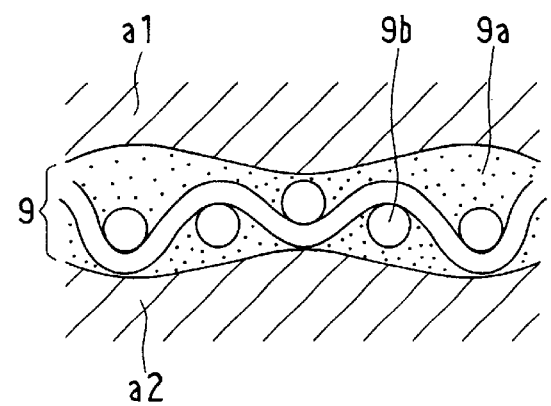

As a modified example of the third type, as shown in FIG. 8B, a metallic mesh formed by weaving metallic wires is used as the compounding member 9b. The metallic mesh is disposed between the two members a1 and a2, and resin is applied for joining. In this case, because the metallic wires are previously woven, they contact with one another, while contacting the two members a1, a2, resulting in high conductivity.

The gaps among the metallic wires are filled with the resin material 9a. The gaps may be filled with resin containing high radiation property fillers disclosed in the first and second types to enhance the radiation property. When the metallic mesh is combined with the connecting fillers in the second type as the compounding member 9b, the radiation effect is further improved. When the mesh was formed by weaving Cu wires of 100 $\mu$m in diameter to be a 100 mesh having a thickness of approximately 200 $\mu$m, and silicone resin containing the connecting Ag fillers described above was coated on the mesh, the thermal conductivity reached 8 W/mK. The mesh may be formed from carbon fibers having high radiation property in place of metallic fibers.

Figure 8C:
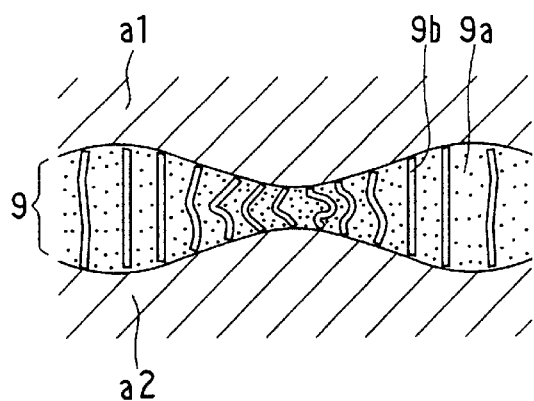
FIGS. 8C, 8D, and 9A to 9D are a fourth example of the contact material.

A fourth type has a constitution capable of securely making contact between the compounding member 9b mixed with the resin material 9a and the two members a1, a2. That is, as shown in FIG. 8C, the two members a1, a2 are connected to each other through the high radiation property compounding member (intervening member) 9b interposed therebetween. The material forming the compounding member 9b has flexibility to follow the irregularity and waviness of the members a1, a2. The following four examples are applicable as the intervening member.

First, a first example is a flexible fiber. The fiber has a thin diameter to have flexibility by bending. This fiber is disposed between the two members a1 and a2 to contact the members a1, a2 at both ends thereof. In practice, plural fibers are embedded in a resin or rubber material 9a having flexibility in parallel with one another, are cut with a specific length, and is sandwiched between the two members a1 and a2 (see FIG. 8C). The material 9a may be made of silicone gel, silicone system resin, polyester system resin, or the like, in addition to rubber.

Because both fibers and rubber have flexibility to deform along the surface irregularity of the members a1, a2, the fibers can contact both members a1, a2 at respective ends thereof. A radiation passage are provided in a direction in which the fibers elongate, resulting in sufficient radiation. The fibers may be made of glass, nylon system resin such as fishline, metal (Cu, Ni, Au, Ag, or the like), carbon, or the like. Especially when metal or carbon have high thermal conductivity is used as the fibers, the radiation effect becomes high.

Figure 8D:
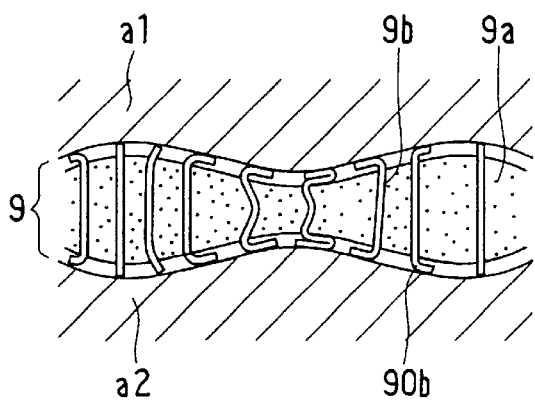

Further, the surface resin (rubber) portion may be removed as shown in FIG. 8D using acid or alkaline solution so that the fibers protrude from the surfaces as protruding portions 90b. Accordingly, the flexibility is further increased and the fibers easily contact the both members a1, a2. When the flexibility of the fibers is insufficient, the resin (rubber) material portion may be molten so that the fibers are deformed or moved along the surface irregularity of the members a1, a2 while interposing between the members a1, and a2.

For instance, the structure is formed using thermosetting resin that is solid at a room temperature, and is heated after being placed between the members a1 and a2. The resin is molten once by heating, and accordingly the fibers are deformed and moved along the members. After that, the resin is solidified by heat curing to fix the fibers therein. The structure may be formed using thermoplastic resin, and it may be molten by heating when assembling, and solidified by cooling.

Figure 9A:
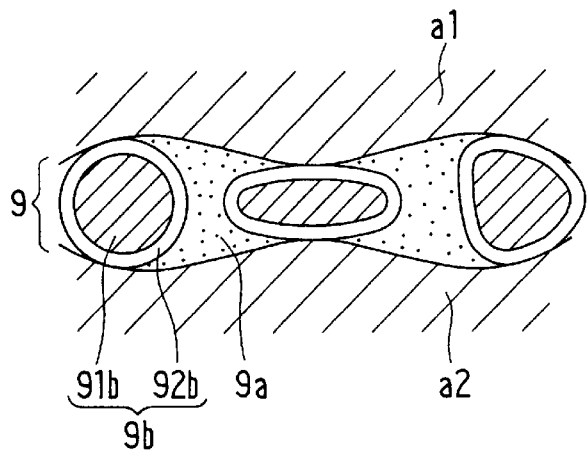

Next, a second example shown in FIG. 9A is a compounding member 9b composed of flexible core members 91b having a diameter larger than the gap provided between the two members a1 and a2. The surfaces of the core members 91b are coated with a thermal conductive radiation layer 92b. For instance, the flexible core members 91b are made of polyester and are plated with metal as the radiation layer 92b. These core members 91b are deformed by being sandwiched between the members a1 and a2 so that they directly contact both members a1, a2.

When the diameter of the compounding member 9b is smaller than the gap between the members a1 and a2, the compounding member 9b may be woven or gathered together to cooperatively have an increased thickness while keeping flexibility. This kind of compounding member is commercialized as a trade name "DENGY CLOTH" (core member:polyester, radiation layer:cloth-like woven nickel fibers) produced by Nisshinbo Co., Ltd., "TEXTO GLASS" (core member:glass fiber, radiation layer:nickel) produced by Kanebo Co., Ltd., and the like. Spherical resin beads plated with metal is also applicable.

Figure 9B:
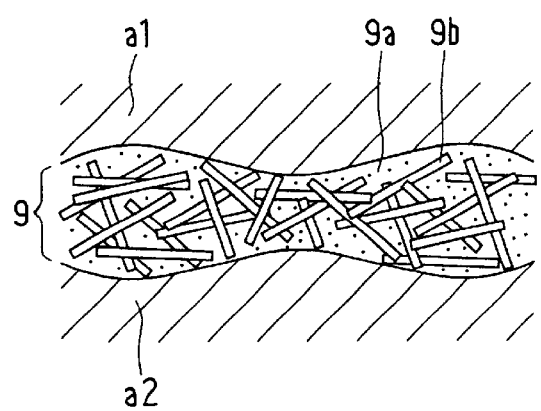

As shown in FIG. 9B, a third example is a compounding member 9b composed of metallic nonwoven fabric cloth. The metallic nonwoven fabric cloth can be formed by pressing and baking short metallic fibers gathering together to be a cloth-like shape or by pressing randomly entangled long metallic fibers to be a cloth-like shape. The thus formed nonwoven fabric cloth includes overlapping fine fibers, thereby providing high flexibility. Accordingly, the cloth can fit the irregularity of the members a1, a2. The nonwoven fabric cloth may be formed from carbon fibers in place of from metallic fibers.

Figure 9C:
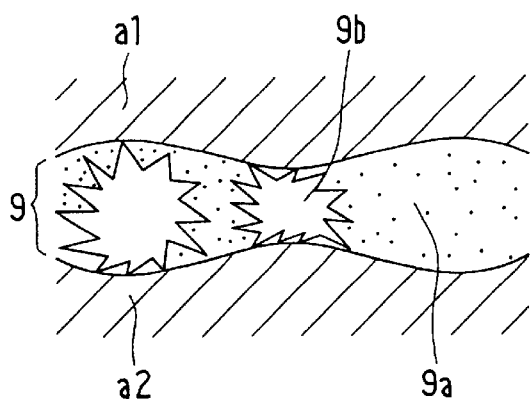
Figure 9D:
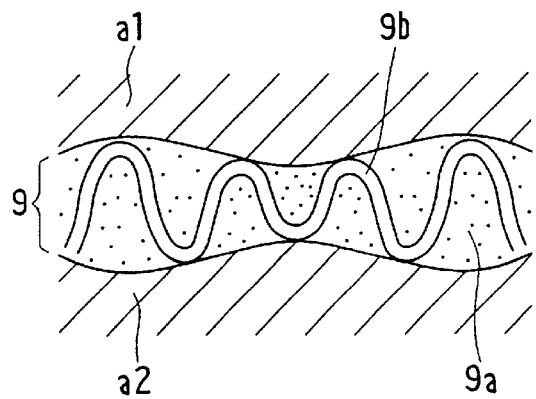

Further, a fourth example is a compounding member 9b composed of metallic fillers which are partially flexible. For instance, Ni particles having plural protrusions on surfaces thereof can be used as the fillers as shown in FIG. 9C. When the Ni particles are sandwiched between the members a1 and a2, the protrusions, which are fine and have small rigidity, are easily deformed along the members a1, a2 to directly contact the members a1, a2. Further, a wave-shaped metallic foil or a metallic foil having surface irregularity may be used as the compounding member 9b as shown in FIG. 9D. Likewise, such foils can be deformed along the irregularity and waviness of the members a1, a2.

The compounding member 9b may be composed of only one or a combination of the first to fourth examples described above. Further, the first to fourth types of the radiation materials 9 may be appropriately combined with at least any one the first to fourth examples. The application of the high thermal-conductive radiation material 9 described above is not limited to the semiconductor apparatus which produces heat from both surfaces thereof. The radiation material 9 can be effectively applied to, for instance, a semiconductor apparatus including a semiconductor element which contacts a radiation unit such as the cooling block described above or a conventional radiation fin through an insulation substrate only at one side surface thereof, i.e., a semiconductor apparatus including a semiconductor element which produces heat only from one side surface thereof.

Second Embodiment

Figure 10:
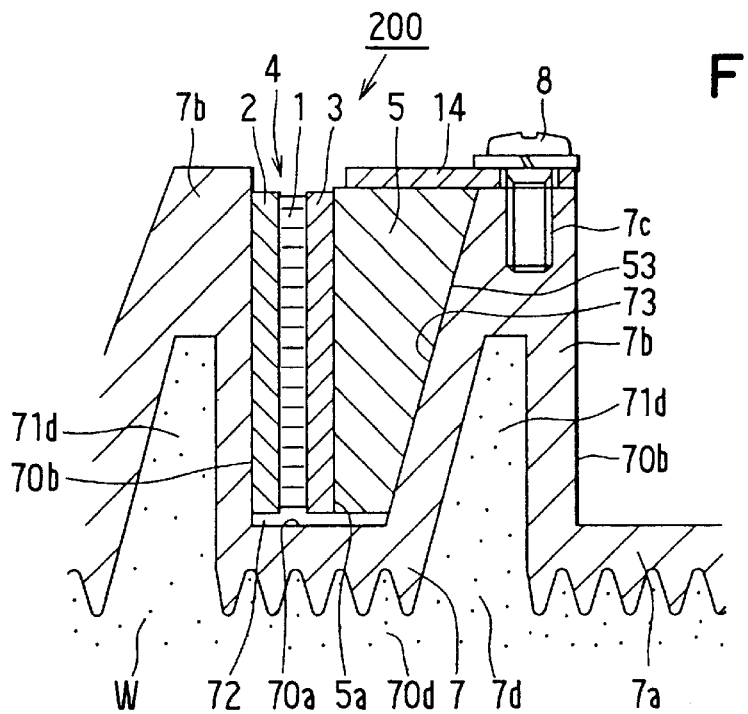
FIG. 10 is a cross-sectional view partially showing a semiconductor apparatus according to a second preferred embodiment.

A semiconductor apparatus 200 in a second preferred embodiment will be explained referring to FIG. 10, in which parts of electrode patterns 21, 31 projecting from insulation substrates 2, 3 are omitted. In FIG. 10, the same parts and components as in the first embodiment are indicated by the same reference numerals.

As shown in FIG. 10, a cooling block 7 has two protruding portions 7b protruding from a flat surface 70a of a base portions 7a in the same direction with the same shape. A substrate unit 4 is fixedly press-fitted between the two protruding portions 7b. Each of the protruding portions 7b has a flat surface 70b approximately perpendicular to the surface 70a as in the first embodiment, and has a width which gradually increases as approaching to the base portion 7a. An inclined surface 73 is provided on an opposite side of the flat surface 70b. Further, a sub-passage 71b is provided inside the protruding portion 7b.

A shape of a first radiation block 5 in the second embodiment is also different from that in the first embodiment. As shown in FIG. 10, the first radiation block 5 in the second embodiment defines a recess 72 with one of the protruding portions 7b (on the left side in FIG. 10) with a flat surface 5a thereof facing the protruding portion 7b as in the first embodiment. However, the contact with the cooling block 7 is provided not on the base portion 7a of the cooling block 7 but on the inclined surface 73 of the other side protruding portion 7b. Therefore, the first radiation block 5 has an inclined surface 53 that contacts the inclined surface 73 of the other side protruding portion 7b with a shape corresponding to that of the inclined surface 73.

The semiconductor apparatus 200 additionally adopts an elastic member 14 as a pushing member in place of the second radiation block 6 in the first embodiment. The elastic member 14 is made of rubber, spring member, or the like. The other side protruding portion 7b has a threaded hole 7c, and the elastic member 14 is fixed to the other side protruding portion 7b at an end thereof in a cantilevered state by a screw 8 engaged with the threaded hole 7c.

When the screw 8 is inserted into the threaded hole 7c, the other free end of the elastic member 14 pushes the upper surface of the first radiation block 5. Accordingly, the first radiation block 5 moves downward in FIG. 10 along the inclined surface 73 of the cooling block 7 while receiving a pushing force from the inclined surface 7 at the pushing portion contact surface 53. The flat surface 5a pushes the outer surface of the insulation substrate 3 toward the flat surface 70b of the protruding portion 7b on the opposite side of the insulation substrate 3. Accordingly, the substrate unit 4 is pushed at both outer surfaces of the insulation substrates 2, 3, thereby being press fitted within the recess 72.

As in the first embodiment, the high thermal-conductive radiation material 9 is disposed in the contact interfaces between the insulation substrates 2, 3, and the respective blocks 5, 7 as in the first embodiment to enhance the radiation property by securing adhesiveness and thermal conductivity at the contact interfaces. Similarly, the insertion direction of the substrate unit 4 is the same as that of the screw 8, resulting in easy assembling and flexibility for arranging the element. The substrate unit 4 can be temporarily fixed by the first radiation block 5. Furthermore, a simplified small-sized structure can be realized by providing a single refrigerant passage 7d as in the first embodiment.

Third Embodiment

A semiconductor apparatus 300 in a third preferred embodiment will be explained referring to FIG. 11. The substrate unit 4 has the same structure as that in the first and second embodiments, and parts of the electrode patterns 21, 31 are omitted in FIG. 11 as well as in FIG. 10. The same parts and components as in the first embodiment are indicated by the same reference numerals, and only parts different from those in the first embodiment will be explained.

Figure 11:
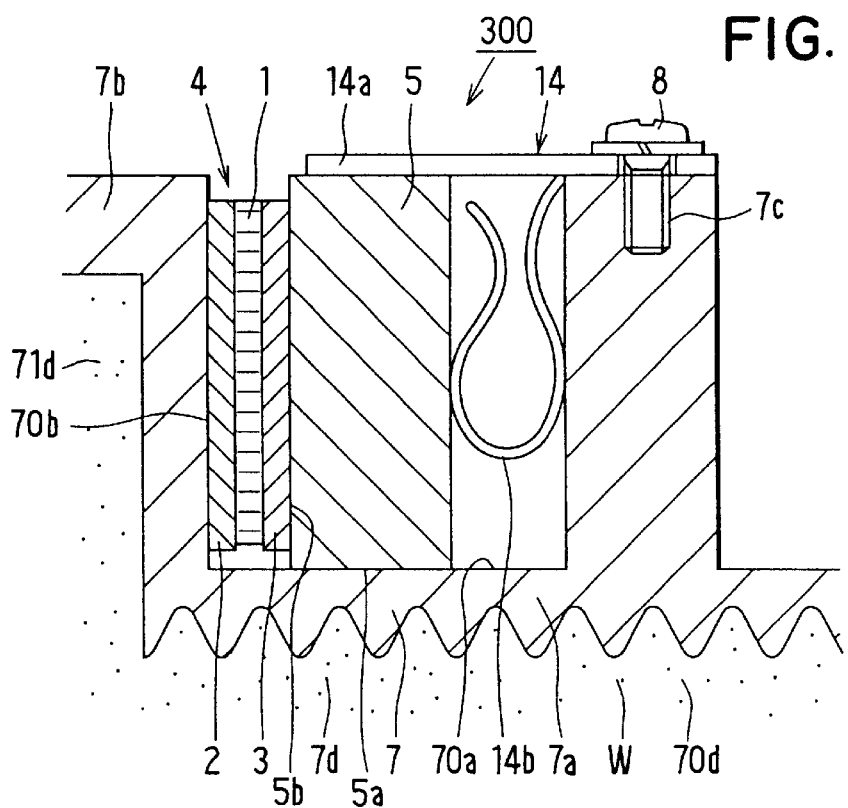
FIG. 11 is a cross-sectional view partially showing a semiconductor apparatus according to a third preferred embodiment.

A first radiation block 5 in the present embodiment is, as shown in FIG. 11, formed into a rectangular shape in cross-section without having any inclined surface. The third embodiment also adopts an elastic member 14 made of rubber, spring member, or the like as a pushing member, in place of the second radiation block 6. The pushing member 14 is composed of a first pushing member 14a that urges the first radiation block 5 from the upper side in FIG. 11, and a curved second pushing member 14b that urges the first radiation block 5 from the right side toward the left side in FIG. 11. The third embodiment can provide the same effects as in the first embodiment by providing the same constitution shown in FIG. 11 symmetrically on the right and left sides of the screw 8.

Fourth Embodiment

Figure 12:
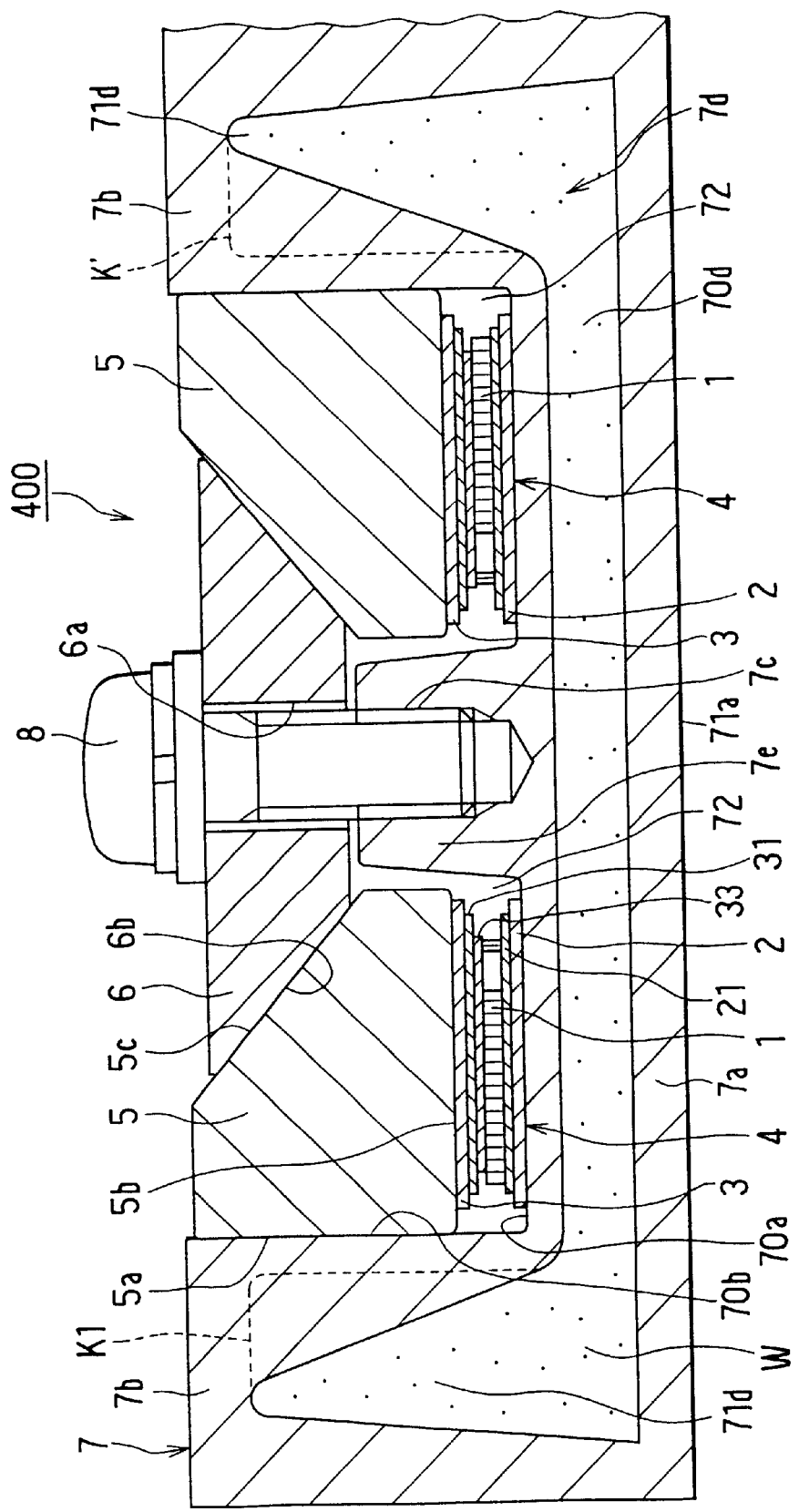
FIG. 12 is a across-sectional view partially showing a semiconductor apparatus according to a fourth preferred embodiment.

A semiconductor apparatus 400 in a fourth preferred embodiment will be explained referring to FIG. 12. The semiconductor apparatus 400 is formed, similarly to the semiconductor apparatus 100 shown in FIG. 4, by forming a substrate unit 4 with a semiconductor element 1 sandwiched between insulation substrates 2, 3, and by press-fitting the substrate unit 4 to a cooling block 7 by radiation blocks 5, 6. The press-fitting is carried out by fastening a screw 8.

A main differential point from the first embodiment is that the substrate unit 4 in the fourth embodiment is disposed parallel to the flat surface 70a of the cooling block 7. In the first embodiment, the substrate unit 4 is disposed perpendicularly to the flat surface 70a of the cooling block 7. Accordingly, in the present embodiment, end portions of electrode patterns 21, 31 on the side of through holes 21c, 31c protrude in a direction perpendicular to the paper space in the figure. The differential points from FIG. 4 will be more specifically explained. In FIG. 12, the same parts and components as those in FIG. 4 are indicated by the same reference numerals.

In the fourth embodiment, the cooling block 7 is composed of a base portion 7a and protruding portions 7b protruding from the base portion 7a. The protruding portions 7b includes first protruding portions 7b in which the sub-passages 71d are defined, and a second protruding portion 7e protruding in the same direction as the first protruding portions 7b and having a threaded hole 7c for receiving the crew 8.

A space defined by the base portion 7a, one of the first protruding portions 7b, and the second protruding portion 7e of the cooling block 7 is used as a recess 72 for accommodating the substrate unit 4. The substrate unit 4 is inserted into the recess 72 from the upper side of the flat surface 70a of the base portion 7a (from the upper side in FIG. 12), and is disposed with the outer surface of the insulation substrate 2 contacting the surface 70a of the cooling block 7. The first radiation block 5 is disposed on the substrate unit 4 with the flat surface 5a thereof contacting the surface 70b of the protruding portion 7b and the flat surface 5b thereof contacting the outer surface of the insulation substrate 3. The first radiation block 5 is inserted into the recess 72 so that the flat surface 5b thereof sandwiches the substrate unit 4 with the flat surface 70a of the cooling block 7 therebetween.

Further, as in the first embodiment, the inclined surface 5c of the first radiation block 5 is pushed by a second radiation block (pushing member) 6 and a screw (support member) 8 which serve as fixing members. Accordingly, the first radiation block 5 is pushed toward the first protruding portion 7b by the second radiation block 6, and is held in contact with the first protruding portion 7b. Simultaneously, the first radiation block 5 is pushed in the insertion direction of the fixing members 6, 8 by the screw 8 to press-fit the substrate unit 4 within the recess 72. Although it is not shown, the high thermal-conductive radiation material 9 is disposed in the interfaces respectively provided between two of the first radiation block 5, the cooling block 7, and the insulation substrates 2, 3.

Next, the radiation effect in the present embodiment will be explained. The heat produced from the substrate unit 4 is transmitted to the base portion 7a of the cooling block 7 from the outer surface of the insulation substrate 2, and simultaneously, transmitted to the protruding portion 7b from the outer surface of the insulation substrate 3 through the first radiation block 5 to be radiated to refrigerant W. Thus, the heat is radiated from both sides of the semiconductor element 1. The effects other than an effect of temporarily fixing the substrate unit 4 by the blocks 5, 7 when it is inserted into the recess 72 are the same as those in the first embodiment. Incidentally, as shown in broken lines K1 in FIG. 12, the sub-passage 71d can be shaped so that the wall thickness of the cooling block 7 defining the sub-passage 71d becomes approximately equal to that defining the main passage 70d to enhance the radiation property.

Fifth Embodiment

In the first embodiment, several recesses 72 are provided by the radiation blocks 5, 7 to receive several substrate units 4. In a fifth preferred embodiment, a fixing member is modified in a semiconductor apparatus 500 capable of holding several substrate units 4 as shown in FIG. 13.

Figure 13:
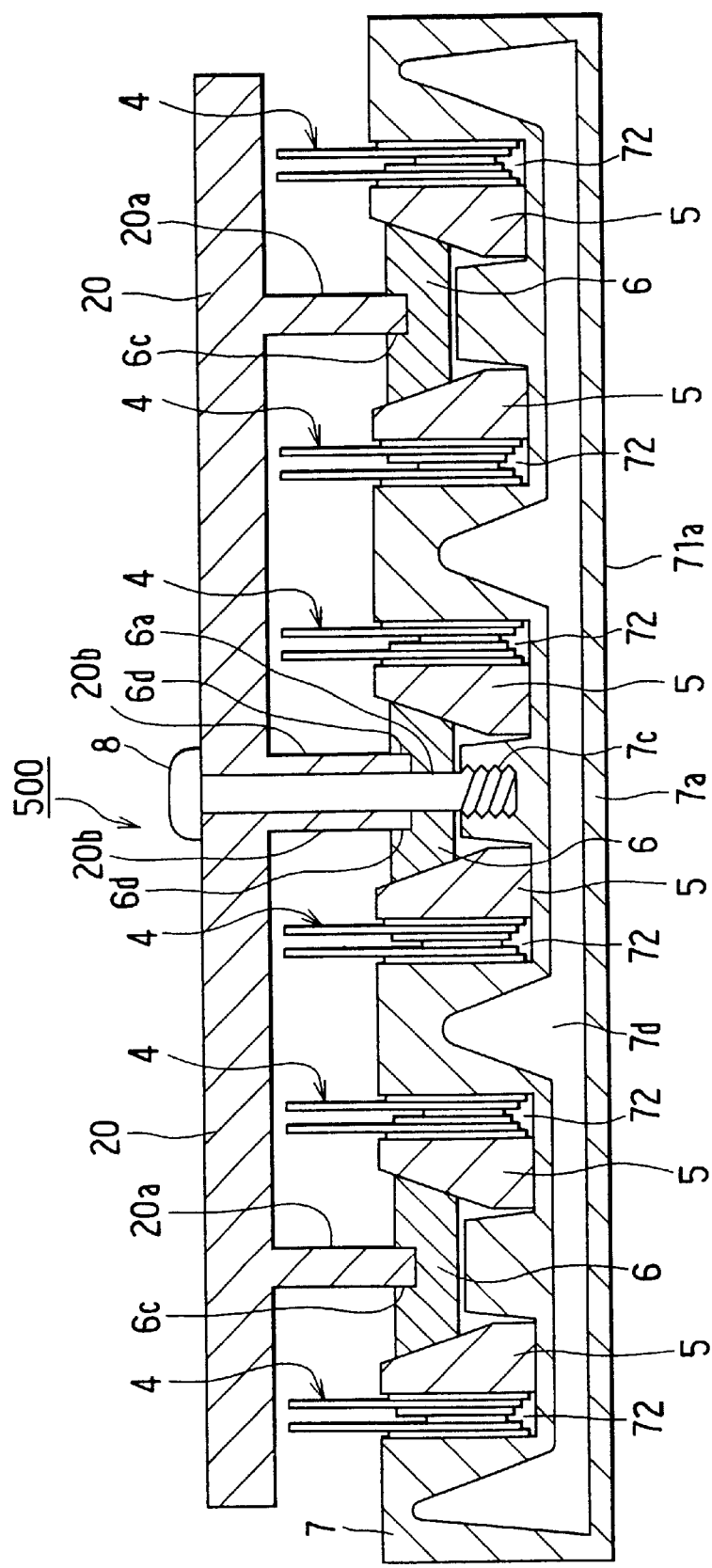
FIG. 13 is a cross-sectional view partially showing a semiconductor apparatus according to a fifth preferred embodiment.

In FIG. 13, six recesses 72 are provided by the radiation blocks 5, 7, and six substrate units 4 are inserted into the respective recesses 72. The fixing member is composed of second radiation blocks (pushing members) 6 for press-fitting the substrate units 4 through the first radiation blocks 5, a plate (batch pushing member) 20 capable of pushing all the substrate units 4 at the same time in the same direction through the second radiation blocks 6, and a screw (support member) 8 for fixing the plate 20 to the blocks 5, 7.

The plate 20 has a plate body and pole-like protruding portions 20a, 20b protruding in the same direction from the plate body. Further, at least one (the central one in FIG. 13) of the second radiation blocks 6 has a hole 6a for receiving the screw 8, and a guide portion 6d dented on the upper surface thereof. The cooling block 7 has a threaded hole 7c at a portion corresponding to the hole 6a.

The plate 20 is, as shown in FIG. 13, screwed to the cooling block 7 by the screw 8 that is engages with the threaded hole 7c passing through the through hole of the plate 20 and the hole 6a. The protruding portion 20b of the plate 20 is fixedly fitted into the guide portion 6d of the center second radiation block 6 at an end portion thereof to push the block 6 in the insertion direction of the screw 8. On the other hand, the protruding portions 20a are fixedly fitted into guide portions 6d of the second radiation blocks 6 provided at both ends of the center block 6, at end portions thereof.

Accordingly, the protruding portions 20a, 20b push the three second radiation blocks 6 in the screw insertion direction by fastening the screw 8. The pushed second radiation blocks 6 further push a pair of the substrate units 4 through the first radiation blocks 5, so that the substrate units 4 are press-fitted within the recesses 72. Thus, according to the present embodiment, because the several substrate units 4 can be fixed to the radiation blocks 5, 7 by only the screw 8, the fixing work is easy.

When the substrate units 4 are two-dimensioanlly arranged, a plate having an area corresponding to the arrangement area of the substrate units 4 and having protrusions corresponding to second radiation blocks is used. According to the constitution shown in FIG. 13, in this case, at least one of the second radiation blocks 6 is pushed directly by the screw 8; however, all the second radiation blocks 6 may be pushed by the protruding portions of the plate when a special threaded hole is formed in the cooling block 7. Also, the plate 20 needs not be always fixed to the blocks 5, 7 by the screw 8, and it may be fixed to the cooling block 7 at the peripheral portion of the cooling block 7 by a clip or the like.

According to the embodiments described above, the substrate unit 4 directly contacts the cooling block 7 at a surface thereof and contacts the cooling block 7 through the first radiation block 5 at the other surface thereof to effectively radiate heat therefrom. These contact faces are pushed by the pushing members 6, 8, 14 to enhance the contacting property thereof. Further, the high thermal-conductive radiation material 9 is disposed between the substrate unit 4 and the respective blocks 5, 7 to enhance the adhesiveness therebetween, resulting in improved radiation property.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor apparatus comprising:
   a substrate unit including a semiconductor element, and a pair of insulation substrates having thermal conductivity and holding the semiconductor element therebetween;
   first and second radiation members for radiation heat produced from the semiconductor element and defining a recess therebetween into which the substrate unit is inserted in an insertion direction in contact with the first and second radiation members; and
   a fixing member for fixing the substrate unit within the recess by being inserted into the first radiation member in the insertion direction of the substrate unit,
   wherein the second radiation member is in contact with the first radiation member to provide a thermal conductive pass between the substrate unit and the first radiation member;

the first radiation member has a base portion and a protruding portion, wherein the base portion defines a refrigerant passage therein in which refrigerant flows, and the protruding portion protrudes from the base portion; and the fixing member includes a support member and a pushing member, wherein the support member is inserted into the protruding portion of the first radiation member, and the pushing member pushers the second radiation member in cooperation with the support member to hold the substrate unit within the recess.

2. The semiconductor apparatus according to claim 1, wherein:

the first and second radiation members form a plurality of recesses for respectively accommodating a plurality of substrate units; and the fixing member further includes a batch pushing member capable of simultaneously fixing the plurality of substrate units upon insertion of the support member into the protruding portion of the first radiation member.

3. The semiconductor apparatus according to claim 1, wherein:

the protruding portion of the first radiation member is a short protruding portion;

the first radiation member further includes a long protruding portion, which protrudes from the base portion by a greater distance than the short protruding portion; and the second radiation member has thermal conductivity and is disposed on the base portion in contact with the base portion, the second radiation member defining the recess with the long protruding portion of the first radiation member.

4. The semiconductor apparatus according to claim 1, wherein the pushing member has thermal conductivity.

5. The semiconductor apparatus according to claim 1, wherein the substrate unit contacts the first radiation member and the second radiation member with a contact material interposed therebetween, the contact material including a resin material having thermal resistance and flexibility, and a thermal-conductive compounding member.

6. A semiconductor apparatus according to claim 1, wherein the second radiation member is in sliding contact with the first radiation member.

7. A semiconductor apparatus comprising:

a substrate unit including a semiconductor element, and a pair of insulation substrates having thermal conductivity and holding the semiconductor element therebetween;

first and second radiation members for radiating heat produced from the semiconductor element and defining a recess therebetween into which the substrate unit is inserted in an insertion direction in contact with the first and second radiation members; and a fixing member for fixing the substrate unit within the recess by being inserted into one of the first and second radiation members in the insertion direction of the substrate unit, wherein the second radiation member is in contact with the first radiation member to provide a thermal conductive pass between the substrate unit and the first radiation member;

the first radiation member has a base portion defining a refrigerant passage therein in which refrigerant flows, and first and second protruding portions both protruding from the base portion in an identical direction to define the recess therebetween;

the substrate unit is disposed on the base portion within the recess;

the second radiation member has thermal conductivity and is disposed on the substrate unit within the recess in contact with at least one of the first and second protruding portions; and the fixing member includes a support member which is inserted into the first protruding portion of the first radiation member in the insertion direction of the substrate unit, and a pushing member for pushing the second radiation member in the insertion direction to press-fit the substrate unit within the recess, in connection with the support member.

8. The semiconductor apparatus according to claim 7, wherein the pushing member has thermal conductivity.

9. A semiconductor apparatus comprising:

a semiconductor element;

a cooling block having a base portion, a protruding portion, a refrigerant passage and a surface facing the semiconductor element in a thermal conductive manner, wherein the protruding portions protrudes from the base portion, and the refrigerant passage extends in the base portion;

a radiation block being in contact with the cooling block in a thermal conductive manner, the radiation block having a surface facing the semiconductor element in a thermal conductive manner; and a fixing member which pushes the radiation block toward a surface of the cooling block where the radiation block is in contact with the cooling block, wherein the fixing member includes a support member and a pushing member, wherein the support member is inserted into the protruding portion of the cooling block, and the pushing member pushes the radiation block in cooperation with the support member.

10. A semiconductor apparatus according to claim 9, further comprising an insulating material disposed between the semiconductor element and the surfaces of the cooling block, and the semiconductor element and the radiation block.

11. A semiconductor apparatus according to claim 9, wherein the refrigerant passage is arranged beyond the surface of the cooling block and a portion where the radiation block is in contact with.

12. A semiconductor apparatus according to claim 9, wherein the surface of the cooling block and the surface of the radiation block forms a recess in which the semiconductor element is inserted.

13. A semiconductor apparatus according to claim 12, wherein the radiation block is slidable on the cooling block along a thickness direction of the recess.

14. A semiconductor apparatus according to claim 13, wherein the fixing member is operable from the same side to which the recess opens to receive the semiconductor element.

15. A semiconductor apparatus according to claim 13, further comprising an insulating material disposed between the semiconductor element and the surfaces of the cooling block, and the semiconductor element and the radiation block.

16. A semiconductor apparatus according to claim 15, wherein the refrigerant passage is arranged beyond where the surface of the cooling block and a portion of the radiation block are in contact.

17. A semiconductor apparatus comprising:

a first radiation member which includes:
- a refrigerant passage which is formed in the first radiation member, wherein the refrigerant passage is defined by a wall; and
- a protruding portion which protrudes outwardly from the wall and has a threaded blind hole;

a second radiation member which is in contact with the first radiation member in a thermally conductive manner;

a semiconductor element which is placed between the first radiation member and the second radiation member to transfer heat generated from the semiconductor element through the first radiation member and the second radiation member;

a pushing member which is placed adjacent to the protruding portion and is in contact with the second radiation member, wherein the pushing member has s through hole which penetrates through the pushing member such that the through hole of the pushing member is substantially aligned with the threaded blind hole of the protruding portion; and a screw which extends through the through hole of the pushing member and is threadably engaged with the threaded blind hold of the protruding portion, wherein the screw urges the pushing member toward the protruding portion upon tightening of the screw, and the pushing member, in turn, urges the second radiation member toward the first radiation member to clamp the semiconductor element between the first radiation member and the second radiation member.

18. A semiconductor apparatus according to claim 17, wherein the pushing member urges the second radiation member in a direction generally perpendicular to an axis of the screw.

19. A semiconductor apparatus according to claim 17, wherein:

the protruding portion of the first radiation member is a short protruding portion;

the first radiation member further includes a long protruding portion, which protrudes from the wall of the first radiation member by a greater distance than the short protruding portion;

the second radiation member has thermal conductivity, is disposed on the wall of the first radiation member in contact with the wall of the first radiation member, and defines a recess in cooperation with the long protruding portion of the first radiation member; and the semiconductor element is received in the recess.

20. A semiconductor apparatus according to claim 17, wherein the pushing member has thermal conductivity.

21. A semiconductor apparatus according to claim 17, wherein;

the semiconductor element is disposed on the wall of the first radiation member; and the semiconductor element is clamped between the wall of the first radiation member and the second radiation member in a direction parallel to the axis of the screw.

22. A semiconductor apparatus according to claim 17, wherein the first radiation member and the second radiation member clamp the semiconductor element in a direction perpendicular to the axis of the screw.

23. A semiconductor apparatus according to claim 17, further comprising a pair of insulation substrates, which have thermal conductivity and hold the semiconductor element therebetween.

24. A semiconductor apparatus according to claim 17, further comprising a batch pushing member, which has a through hole that penetrates through the batch pushing member to receive the screw, wherein:

the second radiation member is one of a plurality of moveable radiation members, which are movable relative to the first radiation member;

the semiconductor element is one of a plurality of semiconductor elements; and the batch pushing member is moved toward the wall of the first radiation member in a direction parallel to the axis of the screw upon tightening of the screw, so that the batch pushing member applies force to each moveable radiation member to move the movable radiation member relative to the first radiation member and to clamp a corresponding one of the semiconductor elements between the movable radiation member and the first radiation member.

* * * * *